(12) United States Patent
Kern et al.

(10) Patent No.: US 9,531,258 B2
(45) Date of Patent: Dec. 27, 2016

(54) CHARGE PUMPS WITH IMPROVED LATCHUP CHARACTERISTICS

(71) Applicant: Infineon Technologies AG, Neubiberg (DE)

(72) Inventors: Thomas Kern, Munich (DE); Ulrich Loibl, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/618,490

(22) Filed: Feb. 10, 2015

(65) Prior Publication Data

US 2015/0155777 A1 Jun. 4, 2015

Related U.S. Application Data

(60) Division of application No. 13/960,141, filed on Aug. 6, 2013, now Pat. No. 8,981,836, which is a continuation-in-part of application No. 12/956,225, filed on Nov. 30, 2010, now Pat. No. 8,508,287.

(51) Int. Cl.
| | |
|---|---|
| G05F 1/10 | (2006.01) |
| G05F 3/02 | (2006.01) |
| H02M 3/07 | (2006.01) |
| H03L 7/089 | (2006.01) |
| H02M 1/00 | (2006.01) |

(52) U.S. Cl.
CPC ............... *H02M 3/07* (2013.01); *H02M 3/073* (2013.01); *H03L 7/0895* (2013.01); *H02M 2001/0032* (2013.01); *H02M 2003/071* (2013.01); *Y02B 70/16* (2013.01)

(58) Field of Classification Search
CPC .. H02M 3/07; H02M 3/073; H02M 2003/075; H02M 2003/076; G11C 5/145

USPC ................. 327/156–158, 536, 537
See application file for complete search history.

(56) References Cited

U.S. PATENT DOCUMENTS

| | | | |
|---|---|---|---|
| 5,982,223 A | 11/1999 | Park et al. | |
| 6,130,574 A | 10/2000 | Bloch et al. | |
| 6,137,344 A | 10/2000 | Miki | |
| 6,198,342 B1 | 3/2001 | Kawai | |
| 6,452,438 B1 | 9/2002 | Li | |
| 6,549,474 B2 | 4/2003 | Liu | |
| 6,878,981 B2 | 4/2005 | Eshel | |
| 6,888,400 B2 | 5/2005 | Lin et al. | |
| 7,042,275 B2 | 5/2006 | Suwa et al. | |

(Continued)

OTHER PUBLICATIONS

Maxim "Charge Pump DC-DC." http://www.microsoft.eu/Tutorial/cpdcdc.htm. 3 Pages.

(Continued)

*Primary Examiner* — Lincoln Donovan
*Assistant Examiner* — Diana J Cheng
(74) *Attorney, Agent, or Firm* — Eschweiler & Associates, LLC

(57) ABSTRACT

Some embodiments of the present disclosure relate to improved regulators for charge pumps. Such regulators selectively activate a charge pump based not only on the voltage output of the charge pump, but also on an series of wake-up pulses that are delivered at predetermined time intervals and which are delivered independently of the voltage output of the charge pump. Hence, these wake-up pulses prevent extended periods of time in which the charge pump is inactive, thereby helping to prevent latch-up in some situations.

19 Claims, 5 Drawing Sheets

(56) References Cited

U.S. PATENT DOCUMENTS

| | | |
|---|---|---|
| 7,123,077 B2 | 10/2006 | Chiu et al. |
| 7,215,179 B2 | 5/2007 | Yamazoe et al. |
| 7,253,676 B2 | 8/2007 | Fukuda et al. |
| 7,301,388 B2 | 11/2007 | Kim |
| 7,307,466 B2 | 12/2007 | Imamiya |
| 7,342,438 B2 | 3/2008 | Muneer et al. |
| 7,714,636 B2 | 5/2010 | Chang et al. |
| 8,041,056 B2 | 10/2011 | Kinoshita |
| 8,212,608 B2 | 7/2012 | Larsen et al. |
| 2009/0278515 A1* | 11/2009 | Broussard ............... G05F 1/577 323/267 |
| 2012/0133424 A1 | 5/2012 | Kern et al. |

OTHER PUBLICATIONS

Maxim "DC-DC Conversion Without Inductors." http://www.maxim-ic.com/app-notes/index.mvp/id/725. 5 Pages.

Wikipedia "Charge Pump." http://en.wikipedia.org/wiki/Charge_pump. 3 Pages.

Non-Final Office Action dated Aug. 2, 2012 for U.S. Appl. No. 12/956,225.

Notice of Allowance dated Apr. 12, 2013 for U.S. Appl. No. 12/956,225.

Non-Final Office Action dated Jul. 17, 2014 for U.S. Appl. No. 13/960,141.

Notice of Allowance dated Nov. 28, 2014 for U.S. Appl. No. 13/960,141.

\* cited by examiner

US 9,531,258 B2

CHARGE PUMPS WITH IMPROVED LATCHUP CHARACTERISTICS

REFERENCE TO RELATED APPLICATION

This Application is a Divisional of U.S. patent application Ser. No. 13/960,141 filed Aug. 6, 2013 which is a Continuation In Part of U.S. application Ser. No. 12/956,225 filed on Nov. 30, 2010.

BACKGROUND

Many electronic devices formed on an integrated circuit (IC), such as flash memory or electrically erasable programmable memory (EEPROM) for example, require voltage pulses with relatively large magnitudes for program and/or erase operations. In many electronic devices, these required voltage pulses are larger than a supply voltage powering the IC. For example, some flash memory chips often receive a supply voltage of about 5 volts on an external IC pin (many flash chips receive a supply voltage that is even lower than 5 volts), but require a "boosted" voltage of about −15 volts for erase operations.

Charge pumps are one type of circuit capable of delivering an output voltage with a "boosted" magnitude. To provide such a boosted output voltage, charge pumps include a number of switching elements arranged in series with one another, wherein charge transfer nodes are disposed between adjacent switching elements. Capacitors are coupled such that each capacitor has one plate coupled to a respective charge transfer node and has another plate coupled to one of at least two clock lines. Conventional charge pumps are regulated solely by monitoring an output voltage at an output node of the charge pump. In some negative charge pump implementations, for example, the charge pump is regulated so it continues to pump so long as the output voltage is higher than a target value. For example, if the target value is −16V, and the charge pump output is currently at −13V, the charge pump will continue to pump until the target value is reached. When the pump reaches the target voltage, the pump turns off. If the voltage output subsequently rises above the target voltage (e.g., rises to −10V), pumping commences again. Positive feedback continues in this manner such that the pump voltage output remains at or near the target voltage in a relatively constant manner.

Although such a regulation mechanism is adequate in some respects, difficulties can arise if the charge pump is inactive for an extended time period. For example, FIG. 1A shows a set of waveforms 100 that include an output voltage 102 provided by a conventional negative charge pump and a corresponding regulation signal 104. When the regulation signal 104 is low (e.g., at 108, 110), the charge pump is active; and when the regulation signal is high (e.g., at 112), the charge pump is inactive. Thus, during a first time interval 106 in which a load at the output of the charge pump is active (e.g., load is sourcing or sinking current), the charge pump is periodically activated (e.g., at 108 and 110) to keep the output voltage 102 at or near a target value 112 (e.g., −16 V). During a second time interval 114 in which the load is de-activated, the charge pump is continuously inactive and the output voltage continues to remain at or near the target value 112. Thus, FIG. 1A's chart illustrates proper charge pump functionality until the end of the second time interval 114.

Notably, however, at the end of the second time interval 114, there is an unexpected and rapid breakdown of the negative pump output at 116. For example, at 116 the output voltage 102 can rapidly go from the target output voltage 112 (e.g., −16V) to a less negative output voltage (e.g., −3V). Although the regulation signal 104 is quickly activated at 118 to try to alleviate the rapid voltage breakdown, the charge pump is unable to quickly pump the output voltage 102 back down to the target output voltage 112. This failure condition during time 120, can be due to a bipolar effect (such as latch-up, for example).

To illustrate one particular example of how latch-up can arise in a manner consistent with FIG. 1A's failure condition, FIG. 1B shows one switching element of a charge pump in the form of a triple well high voltage NMOS transistor 150. The transistor 150 is formed on a p-type substrate 152, and includes an n-type well 154, a p-type well 156, and n-type source/drain regions 158, 160. During normal operation, a gate voltage is selectively applied to a gate electrode 162 to form a conductive channel of charged carriers in a channel region 164 under the gate electrode 162, thereby coupling the source/drain regions 158, 160 to one another. However, when the charge pump is inactive for a long time period, the transistor 150 is correspondingly "open" throughout this time (i.e., gate voltage is continuously de-asserted throughout this long time period). Hence, the potential on the p-well 156 can begin to increase (e.g., by temperature dependent charging current of the reverse biased pn junction formed by pwell 156 and nwell 154) ultimately leading to a forward bias being generated over pwell/source or pwell/drain junction and causing turn-on of the vertical npn transistor formed by n-source/158/pwell156/nwell154 and/or n-drain160/pwell156/nwell154 leading eventually to latch-up of the vertical 4-layer stack.

To remedy these shortcomings, the present disclosure provides improved charge pumps that limit failures due to latch-up.

DETAILED DESCRIPTION

Figure 1A:
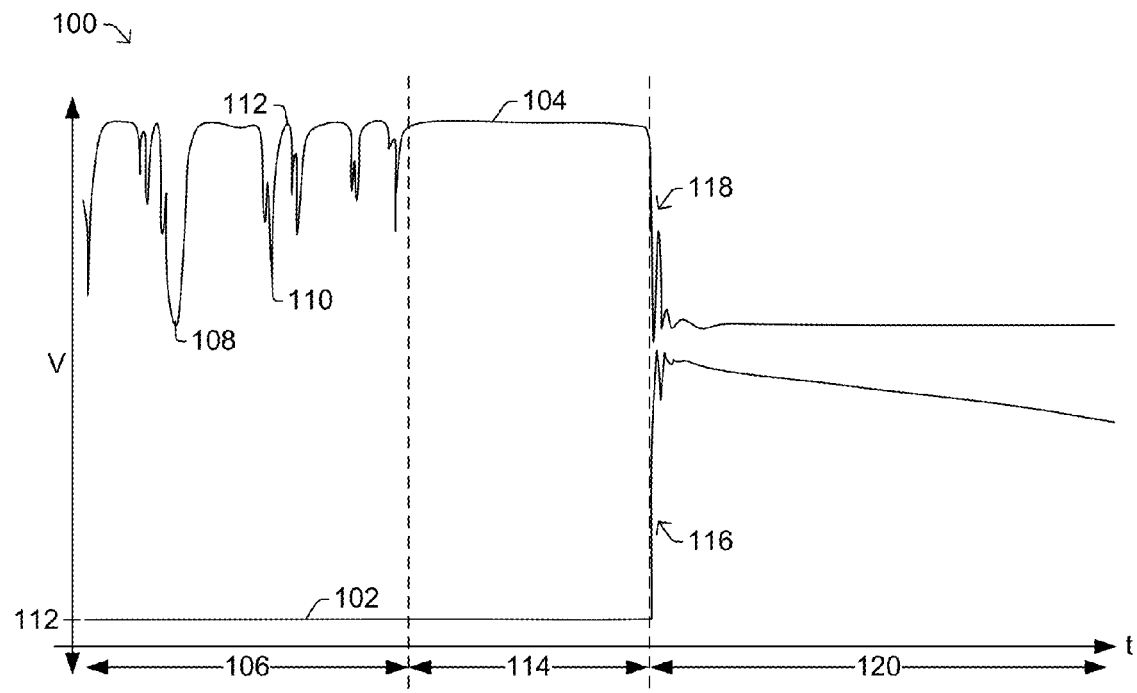
FIG. 1A is a waveform diagram that illustrates a failure condition of a conventional charge pump.
Figure 1B:
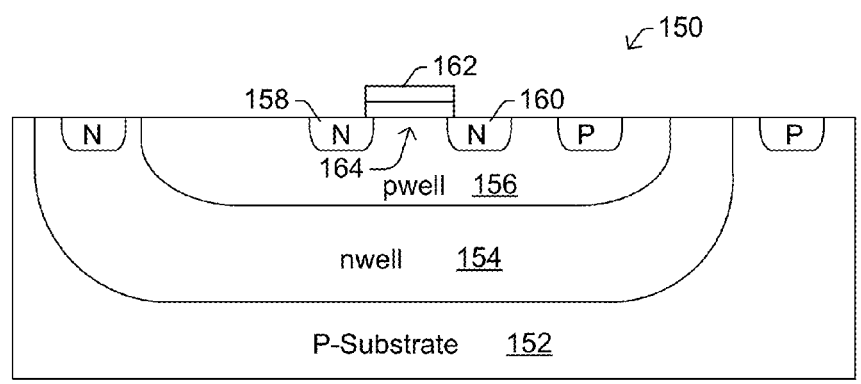
FIG. 1B shows an example of a HV-NMOS transistor that can be utilized as a switching element in a charge pump.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details.

Some embodiments of the present disclosure relate to improved regulators for charge pumps. Such regulators selectively activate a charge pump based not only on the voltage output of the charge pump, but also on an series of wake-up pulses that are delivered at predetermined time intervals and which are delivered independently of the voltage output of the charge pump. Hence, these wake-up pulses prevent extended periods of time in which the charge pump is inactive (see e.g., FIG. 1A's extended period of time 114 in which the charge pump is inactive), thereby helping to prevent latch-up in some situations.

Figure 2:
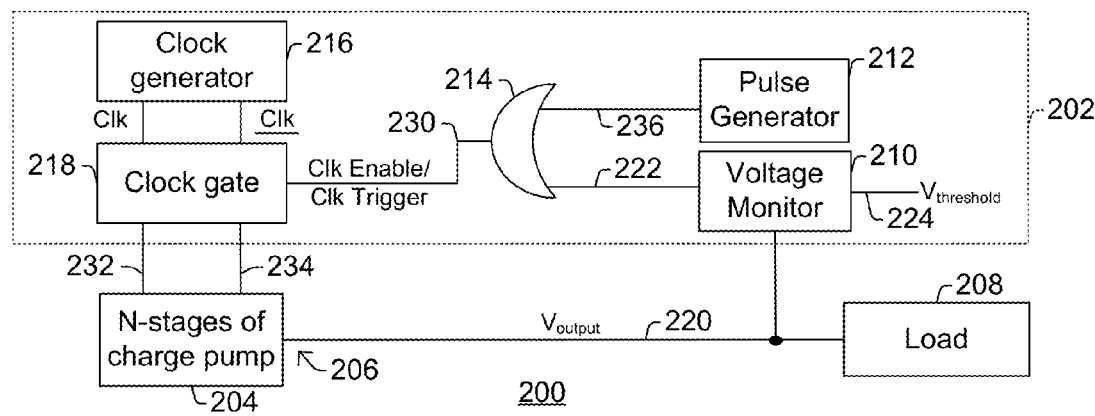
FIG. 2 is a block diagram of a charge pump that utilizes a digital regulator in accordance with some embodiments.

FIG. 2 illustrates a charge pump 200 that includes a regulator 202 in accordance with some embodiments. The charge pump 200 includes a number (N) of charge pump stages 204, wherein the last charge pump stage includes a charge pump output 206 operably coupled to a load 208 (e.g., flash memory cell). Each of the charge pump stages typically receives a gated clock signal 232 and an inverted version of the gated clock signal 234. These clock signals collectively establish different clock phases for properly biasing capacitors and transistors in the N-stage charge pump 204, thereby "pumping" charge through consecutive stages of the charge pump to deliver a desired output voltage $V_{output}$ to the load 208 via the charge pump output 206.

Figure 3:
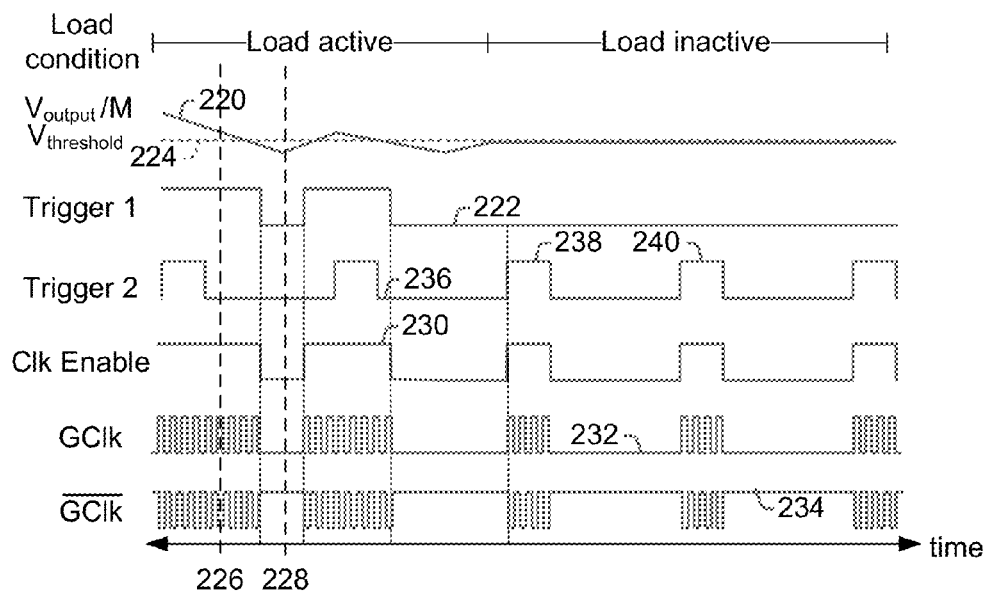
FIG. 3 is an example timing diagram consistent with FIG. 2's embodiment.

The regulator 202 includes a voltage monitor 210, a pulse generator 212, a logical-OR gate 214, a clock generator 216, and a clock gating module 218, which are operably coupled as shown. Referring now to FIGS. 2-3 collectively, operation of the regulator 202 and charge pump 200 are discussed. During operation, the voltage monitor 210 monitors an output voltage 220 at the charge pump output 206. The voltage monitor 210 then selectively activates a first trigger signal 222 based on whether the output voltage 220 (or a fraction of the output voltage $220=V_{output}/M$) has a predetermined relationship with a predetermined voltage threshold 224. For example, at time 226 the output voltage 220 (or a fraction of the output voltage $V_{output}/M$) is higher than the voltage threshold 224, so the first trigger signal 222 is activated. In contrast, at time 228, the output voltage 220 (or a fraction thereof) is less than (more negative than) the predetermined voltage threshold 224, so the first trigger signal 222 is deactivated. Due to the logical-OR gate 214, the first trigger signal 222 correspondingly activates the clock enable signal 230, which selectively provides the gated clock signal 232 and inverse gated clock signal 234 to the N-stage charge pump 204. When active, these clock signals 232, 234 control the N charge pump stages 204 so as to incrementally transfer charge through consecutive pump stages in a manner that regulates the voltage on the charge pump output 206 towards the predetermined voltage threshold 224.

To prevent the N charge pump stages 204 from being de-activated for extended periods of time (e.g., which as shown in FIG. 1A can lead to latch-up), the pulse generator 212 generates a second trigger signal 236 having a series of wake-up pulses (e.g., 238, 240) that are spaced at predetermined time intervals. Although the wake-up pulses are shown as occurring at regularly spaced time intervals, in other embodiments the time intervals can be non-regularly spaced or can be spaced in other ways (e.g., random or pseudo-randomly). Due to the logical-OR gate 214, the second trigger signal 236 also triggers the clock enable signal 230, and ultimately activates the N charge pump stages 204 via the gated clock signals 232, 234. Consequently, the regulator 202 helps to reduce the likelihood of latch-up compared to conventional charge pumps, in particular due to the pulse generator 212.

Although FIG. 3 shows one example of a set of waveforms consistent with FIG. 2's embodiment, it will be appreciated that these waveforms are merely an example of sample functionality to aid in the reader's understanding, and are not limiting in any way. For example, in some other implementations the polarities of the signals could be inverted, provided that corresponding changes are made to charge pump (e.g., replace the logical-OR gate with a logical-NAND gate or make other changes in the various components). A myriad of other changes could also be made.

Figure 4:
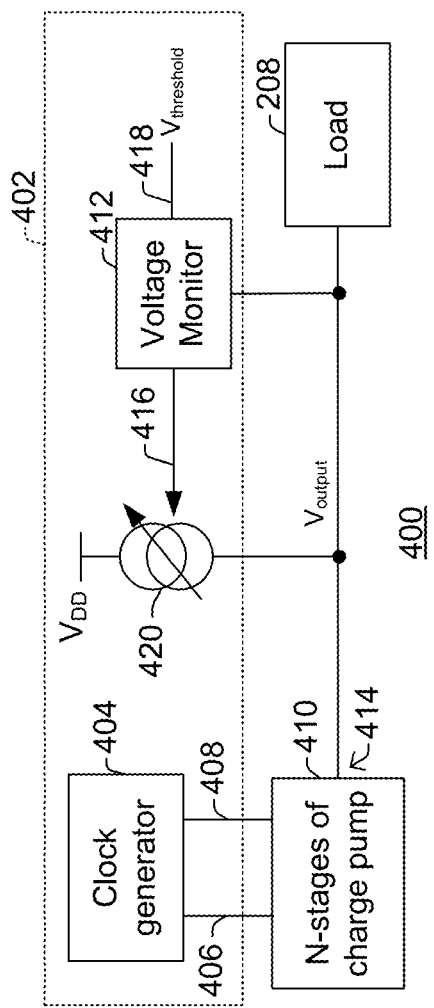
FIG. 4 is a block diagram of a charge pump that utilizes an analog regulator in accordance with some embodiments.

FIG. 4 shows another embodiment of a charge pump 400 that includes a regulator in accordance with some embodiments. In contrast to FIG. 2's charge pump 200, which uses a digital regulator, FIG. 4's charge pump 400 uses an analog regulator 402. The analog regulator 402 includes a clock generator 404 to provide a clock signal 406 and an inverted clock signal 408 to the N charge pump stages 410, thereby facilitating incremental charge transfer along a charge transfer path therein. A voltage monitor 412 monitors an output voltage at the charge pump output 414, and continuously adjusts a voltage level of a control signal 416 based on whether the monitored voltage has a predetermined relationship with a predetermined voltage threshold 418. A variable current source 420 is coupled to the charge pump output 414 and adapted to adjust a current sourced to or sunk from the charge pump output 414 based on the voltage level of the control signal 416.

It will be appreciated that this charge pump 400 typically tends to consume more power than charge pump 200, largely because the clock signals 406, 408 are continuously provided to the N charge pump stages 410. Because there is no clock gating module or clock enable, the pump stage 410 are on for a significant amount of time and the output voltage is regulated by varying the variable current source 420 coupled to the pump output 414. Hence, in many applications where power might be an issue such as mobile applications, charge pump 200, which uses digital regulation, is preferred over charge pump 400, which uses analog regulation, although both are workable solutions in many regards.

Figure 7:
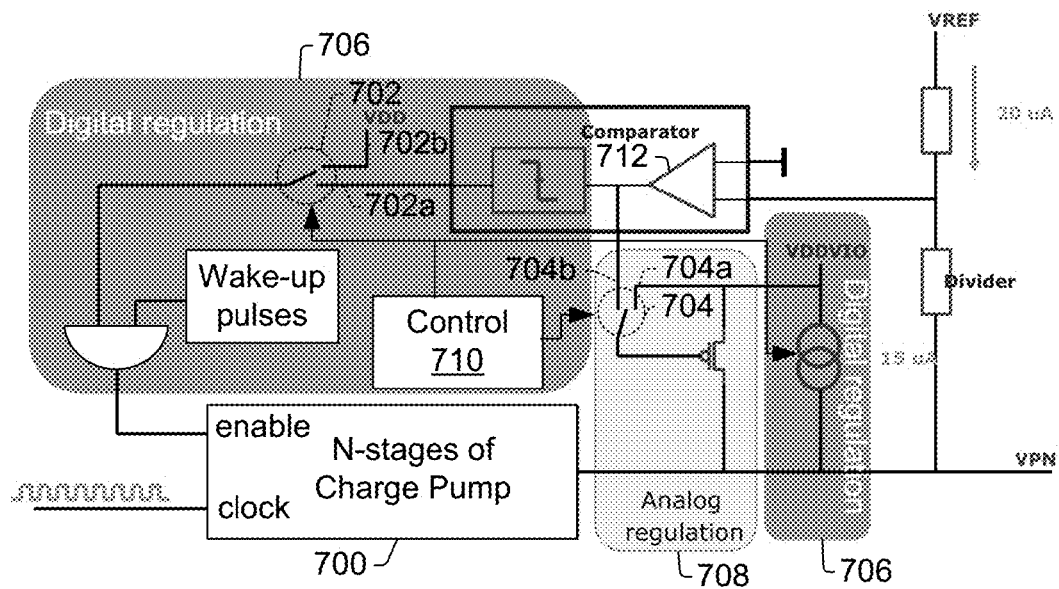
FIG. 7 is a block diagram of a voltage regulation system where digital and analog regulation blocks regulate a voltage output provided by a charge pump.

Combinations of digital and analog regulation can be used in some embodiments. For example, FIG. 7 shows an example where switching elements 702, 704 promote either digital regulation or analog regulation for a charge pump 700 at a given time. For example, if switching element 702 is in position 702a and switching element 704 is in position 704a, then digital regulation block 706 is used to regulate the charge pump 700. In digital regulation, the comparator 712 provides a control signal that selectively enables the charge pump and wake up pulses intermittently cause the charge pump to pump. A variable current source can sink or source current at the output of charge pump to keep the charge due to the wake up pulses from undesirably changing the output voltage. Alternatively, if switching element 702 is in position 702b and switching element 704 is in position 704b, then analog regulation block 708 is used to regulate the charge pump 700. In particularly, the PMOS transistor in analog regulation block 708 can continuously provide charge to the output of the VPN pump. If the charge provided is higher than the pump is able to sink the output node is increasing. In case the PMOS deliver lower charge than the pump current the output node is lowered. Thus, to keep a desired voltage level VPN the charging current is continuously regulated by the comparator based on the voltage on node VPN, thereby enabling analog regulation of charge pump 700. Compared to analog regulation, digital regulation tends to be lower power. However, due to the fact that digital regulation changes state only at discrete time intervals (e.g., clock periods), it is also less accurate than analog regulation which continuously reflects the state of the system. A control block controls 710 provides control signals to set the state of the switches 702, 704 depending whether predetermined voltage conditions and/or timing conditions are met.

Figure 8:
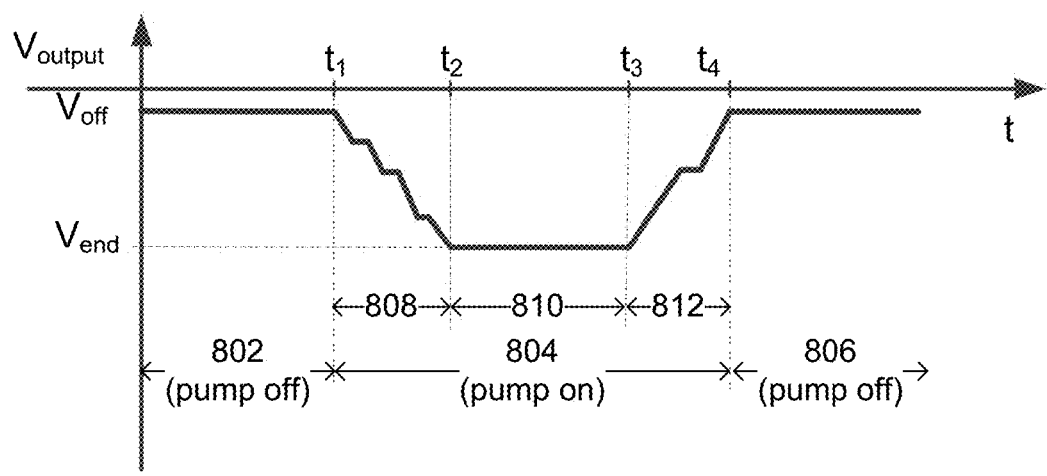
FIG. 8 is a timing diagram illustrating an example of charge pump output voltage regulation.

As shown in FIG. 8, a charge pump can vary between being in an ON state and an OFF state depending on how its voltage output compares to a predetermined voltage threshold (Voff) over time. For example, at 802 the pump is in the off state and the voltage output (e.g., VPN in FIG. 7) is at a predetermined voltage threshold (Voff), which represents the discharge level for normal device operation (e.g., to read a non-volatile memory cell or program the non-volatile memory cell). However, during 804 a lower output voltage level is required (e.g. to erase a cell in a nonvolatile memory). Typically, this lower voltage operation 804 can be divided into three phases: ramping phase at beginning (808) (e.g. charging of the path to the target memory cell), steady ON state (810) (performing the Erase operation on the memory cell), and ramping phase at the end (812) (to prepare for normal operation like read again). Due to the various benefits of analog or digital regulation, analog or digital operation might be preferred depending on the phase. For instance a proper setting for a negative charge pump might be to run phases 808 and 810 in a digital regulation mode due to power reasons, while phase 812 might be run in the analog regulation mode. In phase 812 the pump output and the connected nodes should be discharged in a fast and latch-up free manner. Power is not a primary issue during phase 812 due to relatively fast discharge times. Hence, an analog regulation might be preferred during 812 because the pump is in a continuous operating mode and does not pause. In case a low output voltage ripple is required during phase 810, an analog regulation (for high precision output voltage) might be more beneficial than a digital regulation. In this case phase 808 should run in digital regulation and phase 810 and phase 812 in an analog mode.

Figure 5:
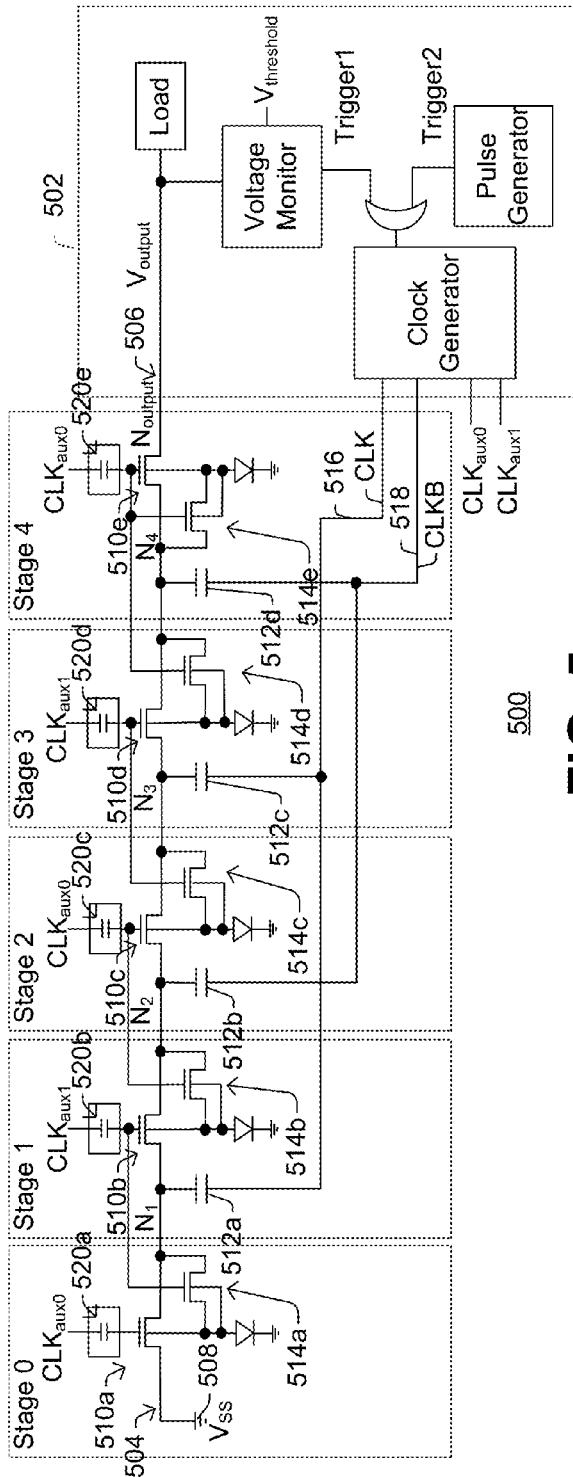
FIG. 5 is a block diagram of a charge pump in accordance with some embodiments.

FIG. 5 shows an example of a negative charge pump 500 that includes four pump stages. It will be appreciated that charge pumps in accordance with this disclosure can have any number of charge pump stages, including less than four or more than four. For purposes of illustration the negative charge pump 500 is shown as coupled to a digital regulator 502, although other embodiments could include an analog regulator in place thereof (e.g., regulator 402 in FIG. 4).

The charge pump 500 includes a charge transfer path 504 extending between a pump output 506 and a DC supply terminal 508 (e.g., ground/$V_{SS}$). Charge transfer transistors 510a, 510b, 510c, 510d, 510e are arranged in series along the charge transfer path 504, wherein charge transfer nodes N1, N2, N3, N4 are disposed between adjacent charge transfer transistors. Capacitors 512a, 512b, 512c, 512d have respective first plates coupled to the charge transfer nodes N1, N2, N3, N4, respectively, and have respective second plates coupled to one of at least two clock lines 516, 518. The clock lines 516, 518 provide different clock signals that collectively establish different clock phases for properly biasing the capacitors and transistors to facilitate charge flow. FIG. 5 shows two clock signals, namely a clock signal (CLK) on the first clock line 516 and an inverted version of the clock signal (CLKB) on the second clock line 518. Auxiliary clocks $CLK_{Aux0}$, $CLK_{Aux1}$ are coupled to auxiliary capacitors 520a-520e as shown, and are used to boost charge transfer transistors 510a, 510e, respectively, into on/off states.

During operation, alternating charge transfer transistors switch in coordinated fashion under the control of the clock signals to incrementally "sweep" or "pump" charge along the charge transfer path 504. In particular, the charge is pumped down the charge transfer path 504 such that the charge is at a first potential at one end of the charge transfer path and is at a second, different potential at the other end of the charge transfer path.

For example, during a first clock phase in which CLK is low and CLKB is high, the charge transfer transistors 510b, 510d are closed, thereby inducing charge transfer from N2 to N1 (and driving the voltage of N1 to be less than the voltage of N2) and similarly inducing charge transfer from N4 to N3 (and driving the voltage of N3 to be less than the voltage of N4). During a second clock phase in which CLK is high and CLKB is low; charge transfer transistors 510a, 510c, and 510e are closed and inducing corresponding charge flow.

To limit body bias effects and to help prevent latch-up, a series of body bias transistors 514a, 514b, 514c, 514d, 514e are also included in the charge pump. A first body bias transistor 514d has a source terminal coupled to a first charge transfer node N4 and has a drain that is coupled to a body of a first charge transfer transistor 510d. The first body bias transistor 514d is operable to selectively couple the first charge transfer node N4 to the body of the first charge transistor 510d based on the first and second trigger signals, via the auxiliary clocks $CLK_{Aux0}$, $CLK_{Aux1}$.

Similarly, a second body bias transistor 514e has a source terminal coupled to the first charge transfer node N4 and has a drain terminal coupled to a body of a second charge transfer transistor 510e. The second body bias transistor 514e is operable to selectively couple the first charge transfer node N4 to the body of the second charge transistor 510e based on the first and second trigger signals via the auxiliary clocks $CLK_{Aux0}$, $CLK_{Aux1}$.

Figure 6:
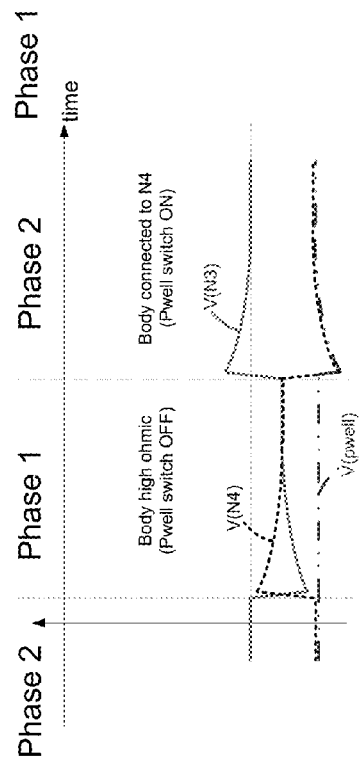
FIG. 6 is an example timing diagram consistent with FIG. 5's embodiment.

In many embodiments, the first charge transfer node N4 is coupled to the bodies of the first and second charge transfer transistors 510d, 510e during a clock phase in which the first charge transfer node N4 is at a minimum voltage potential experienced during charge pumping. Thus, in FIG. 6, for example, body bias transistors 514d, 514e couple the bodies of the first and second charge transfer transistors 510d, 510e to node N4 during the phase 2, because this is the time period during which node N4 is at the minimum voltage potential during charge pumping. This helps to prevent forward bias from a well of the charge transfer transistors with respect to source/drain regions of the charge transfer transistors, which also helps to limit latch-up in many respects.

Although the disclosure has been shown and described with respect to one or more implementations, equivalent alterations and modifications will occur to others skilled in the art based upon a reading and understanding of this specification and the annexed drawings. For example, it will be appreciated that identifiers such as "first" and "second" do not imply any type of ordering or placement with respect to other elements; but rather "first" and "second" and other similar identifiers are just generic identifiers. In addition, it will be appreciated that the term "coupled" includes direct and indirect coupling. The disclosure includes all such modifications and alterations and is limited only by the scope of the following claims. In particular regard to the various functions performed by the above described components (e.g., elements and/or resources), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. In addition, the articles "a" and "an" as used in this application and the appended claims are to be construed to mean "one or more".

Furthermore, to the extent that the terms "includes", "having", "has", "with", or variants thereof are used in either the detailed description or the claims, such terms are intended to be inclusive in a manner similar to the term "comprising."

What is claimed is:

1. A charge pump, comprising:
   a plurality of charge pump stages arranged along a charge transfer path extending between a charge pump output and a DC supply terminal;
   a clock generator to provide a clock signal, an inverted clock signal, and auxiliary clock signals to the plurality of charge pump stages to facilitate charge transfer along the charge transfer path;
   a voltage monitor to monitor a voltage associated with the charge pump output and to continuously adjust a voltage level of a control signal based on whether the monitored voltage has a predetermined relationship with a predetermined voltage threshold; and
   a variable current source or current sink coupled to the charge pump output and adapted to adjust a current sourced to or sunk from the charge pump output based on the control signal.

2. The charge pump of claim 1, wherein the control signal is an analog signal that varies over a continuum of states in time.

3. A voltage regulation system, comprising:
   a charge pump having a charge pump output;
   a digital regulation block to regulate a voltage on the charge pump output during a first time; and
   an analog regulation block to regulate a voltage on the charge pump output during a second time, wherein the first and second times are non-overlapping.

4. The voltage regulation system of claim 3, further comprising:
   a first switching element to selectively enable digital regulation by the digital regulation block;
   a second switching element to selectively enable analog regulation by the analog regulation block; and
   a control block to provide control signals to the first and second switching elements to determine whether the digital regulation block or analog regulation block is controlling regulation of the charge pump at a given time.

5. The voltage regulation system of claim 4, wherein one or more of the control signals is an analog signal that varies over a continuum of states in time.

6. The voltage regulation system of claim 3, wherein the digital and analog regulation blocks selectively enable the charge pump based on whether the voltage has a predetermined relationship with a predetermined voltage threshold.

7. The voltage regulation system of claim 3, wherein the second time corresponds to a ramping phase immediately precedent to a time at which the charge pump is off.

8. The voltage regulation system of claim 3, wherein the first time corresponds to a ramping phase immediately following a time at which the charge pump is off.

9. The voltage regulation system of claim 3, wherein during a third time, which is between the first and second times, the charge pump is in an enabled state in which steady pumping occurs.

10. A voltage regulation system comprising:
    a charge pump having a charge pump output;
    a digital regulation block to regulate a voltage on the charge pump output during a first time; and
    an analog regulation block to regulate a voltage on the charge pump output during a second time;
    wherein the digital and analog regulation blocks selectively enable the charge pump based on whether the voltage has a predetermined relationship with a predetermined voltage threshold; and
    wherein the first time corresponds to a ramping phase immediately following a time at which the charge pump is off.

11. A voltage regulation system, comprising:
    a charge pump having a charge pump output;
    a digital regulation block to regulate a voltage on the charge pump output during a first time; and
    an analog regulation block to regulate a voltage on the charge pump output during a second time;
    wherein the digital and analog regulation blocks selectively enable the charge pump based on whether the voltage has a predetermined relationship with a predetermined voltage threshold; and
    wherein the second time corresponds to a ramping phase immediately precedent to a time at which the charge pump is off.

12. The voltage regulation system of claim 11, wherein the first time corresponds to a ramping phase immediately following a time at which the charge pump is off.

13. The voltage regulation system of claim 12, wherein during a third time, which is between the first and second times, the charge pump is in an enabled state in which steady pumping occurs.

14. The voltage regulation system of claim 13, wherein the charge pump is regulated by the digital regulation block during the third time and is not regulated by the analog regulation block during the third time.

15. The voltage regulation system of claim 13, wherein the charge pump is regulated by the analog regulation block during the third time and is not regulated by the digital regulation block during the third time.

16. A voltage regulation system, comprising:
    a charge pump having a charge pump output;
    a digital regulation block to regulate a voltage on the charge pump output during a first time; and
    an analog regulation block to regulate a voltage on the charge pump output during a second time, wherein the digital regulation block consumes greater power than the analog regulation block per unit time.

17. The voltage regulation system of claim 16, wherein the first time corresponds to a ramping phase immediately following a time at which the charge pump is off.

18. The voltage regulation system of claim 16, wherein the second time corresponds to a ramping phase immediately precedent to a time at which the charge pump is off.

19. The voltage regulation system of claim 16, wherein during a third time, which is between the first and second times, the charge pump is in an enabled state in which steady pumping occurs.

* * * * *